United States Patent
Oh et al.

(10) Patent No.: US 8,993,485 B2
(45) Date of Patent: Mar. 31, 2015

(54) METHODS OF SPLICING 2G REBCO HIGH TEMPERATURE SUPERCONDUCTORS USING PARTIAL MICRO-MELTING DIFFUSION PRESSURIZED SPLICING BY DIRECT FACE-TO-FACE CONTACT OF HIGH TEMPERATURE SUPERCONDUCTING LAYERS AND RECOVERING SUPERCONDUCTIVITY BY OXYGENATION ANNEALING

(71) Applicant: K. Joins, Seoul (KR)

(72) Inventors: Young-Kun Oh, Seoul (KR); Hee-Sung Ann, Daejeon (KR); Myung-Whon Lee, Seoul (KR); Hai-Gun Lee, Seoul (KR)

(73) Assignee: K.Joins, Seoul (KR)

( * ) Notice: Subject to any disclaimer, the term of this patent is extended or adjusted under 35 U.S.C. 154(b) by 103 days.

(21) Appl. No.: 13/882,289

(22) PCT Filed: Oct. 29, 2012

(86) PCT No.: PCT/KR2012/008953
§ 371 (c)(1),
(2) Date: Apr. 29, 2013

(87) PCT Pub. No.: WO2014/058092
PCT Pub. Date: Apr. 17, 2014

(65) Prior Publication Data
US 2014/0296078 A1     Oct. 2, 2014

(30) Foreign Application Priority Data
Oct. 11, 2012  (KR) ........................ 10-2012-0113047

(51) Int. Cl.
*H01L 39/00* (2006.01)
*H01L 39/24* (2006.01)
(Continued)

(52) U.S. Cl.
CPC ......... *H01L 39/2419* (2013.01); *H01L 39/2464* (2013.01); *H01R 4/68* (2013.01);
(Continued)

(58) Field of Classification Search
CPC .................................................... H01L 39/2464
USPC ............................. 505/300, 925, 926; 29/599
See application file for complete search history.

(56) References Cited

U.S. PATENT DOCUMENTS

| 7,268,099 B1 * | 9/2007 | de Rochemont ............... 505/230 |
| 2010/0184604 A1 * | 7/2010 | Roden et al. .................. 505/237 |

(Continued)

FOREIGN PATENT DOCUMENTS

| JP | 2001155566 A | 6/2001 |
| KR | 100175359 B1 | 11/1998 |
| KR | 100964354 B1 | 6/2010 |
| KR | 100964361 B1 | 6/2010 |

(Continued)

*Primary Examiner* — Paul Wartalowicz
(74) *Attorney, Agent, or Firm* — Lowe Hauptman & Ham, LLP

(57) ABSTRACT

Disclosed is a splicing method of two second-generation ReBCO high temperature superconductor coated conductors (2G ReBCO HTS CCs), in which, with stabilizing layers removed from the two strands of 2G ReBCO HTS CCs through chemical wet etching or plasma dry etching, surfaces of the two high temperature superconducting layers are brought into direct contact with each other and heated in a splicing furnace in a vacuum for micro-melting portions of the surfaces of the high temperature superconducting layers to permit inter-diffusion of ReBCO atoms such that the surfaces of the two superconducting layers can be spliced to each other and oxygenation annealing for recovery of superconductivity which was lost during splicing.

10 Claims, 12 Drawing Sheets

(a) Type I (b) Type II

(51) Int. Cl.
*H02G 15/34* (2006.01)
*H01L 39/02* (2006.01)
*H01R 4/68* (2006.01)

(52) U.S. Cl.
CPC .............. *H02G 15/34* (2013.01); *Y02E 40/648* (2013.01); *H01L 39/02* (2013.01); *Y10S 505/925* (2013.01); *Y10S 505/926* (2013.01)
USPC .............. 505/300; 505/925; 505/926; 29/599

(56) References Cited

U.S. PATENT DOCUMENTS

2011/0281735 A1* 11/2011 Mumford et al. ............. 505/237
2012/0065074 A1* 3/2012 Xie et al. ...................... 505/234

FOREIGN PATENT DOCUMENTS

KR  1020110105679 A     9/2011
KR  10-2012-0113047   * 10/2012  ............... H01R 4/68

* cited by examiner

Fig. 1
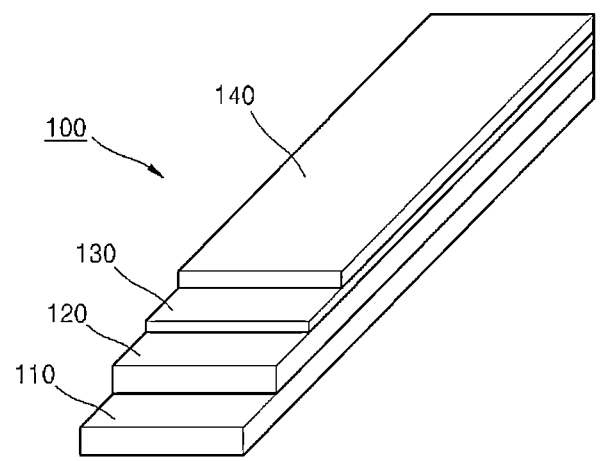
Fig. 2
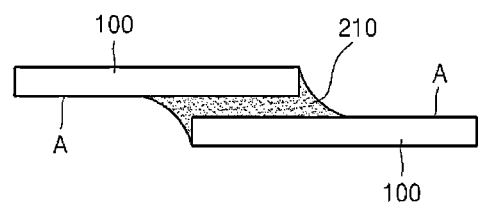
(a)
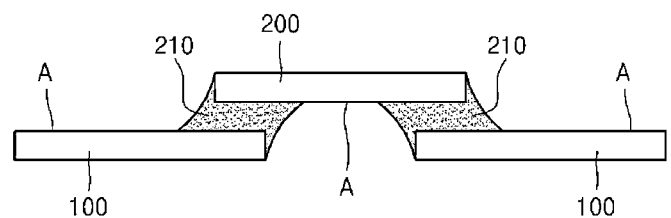
(b)

Fig. 4
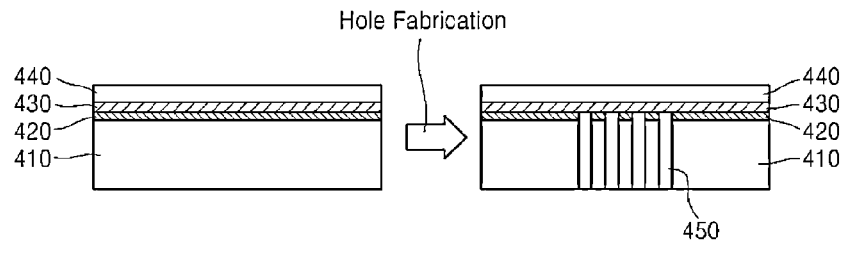
(a) Type I
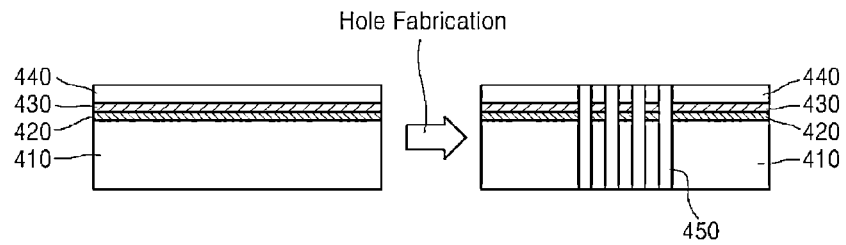
(b) Type II
Fig. 5
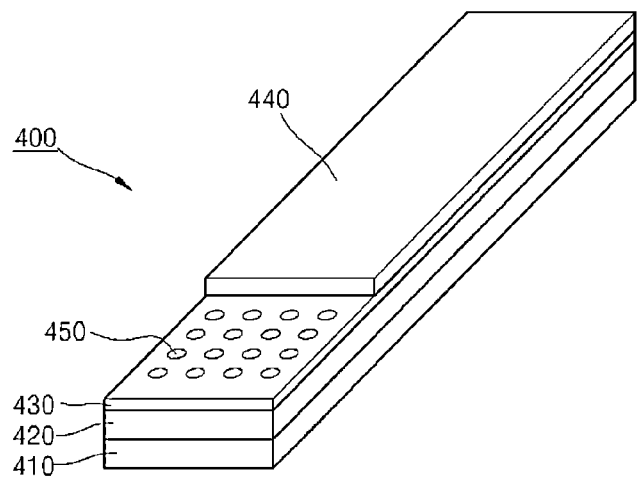

Fig. 6
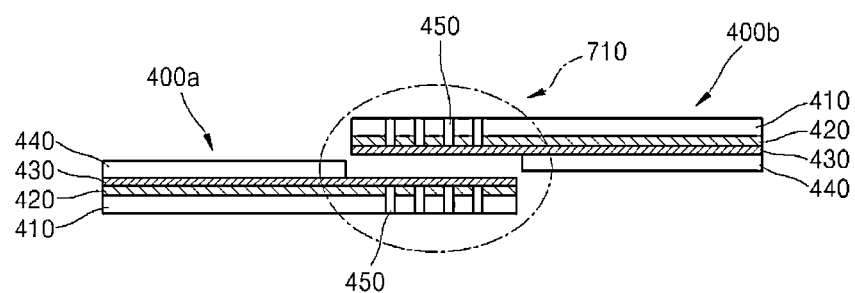
(a) Type I
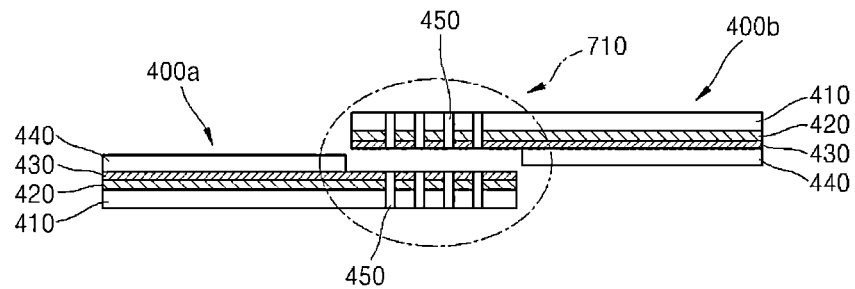
(b) Type II

Fig. 7
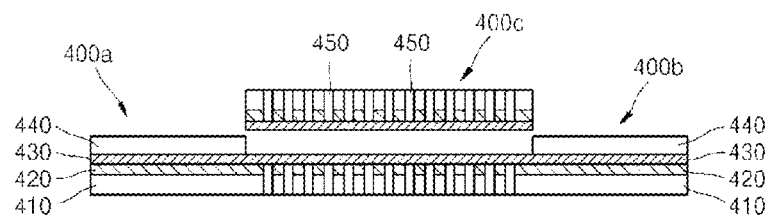
(a) Type I
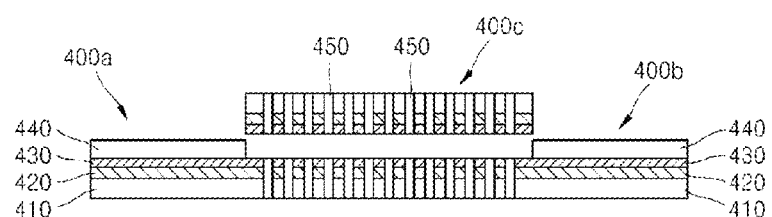
(b) Type II
Fig. 8
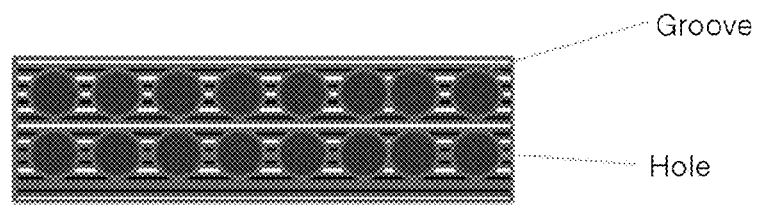

METHODS OF SPLICING 2G REBCO HIGH TEMPERATURE SUPERCONDUCTORS USING PARTIAL MICRO-MELTING DIFFUSION PRESSURIZED SPLICING BY DIRECT FACE-TO-FACE CONTACT OF HIGH TEMPERATURE SUPERCONDUCTING LAYERS AND RECOVERING SUPERCONDUCTIVITY BY OXYGENATION ANNEALING

TECHNICAL FIELD

The present invention relates to a splicing of second generation high temperature superconductor (2G HTS) coated conductors (CC) and superconductivity recovery method through oxygenation annealing of 2G HTS including superconductors such as ReBCO ($ReBa_2Cu_3O_{7-x}$, where Re is a rare-earth materials, and x ranges $0 \leq x \leq 0.6$), and more particularly, to a splicing method of 2G ReBCO HTS CCs exhibiting excellent superconductivity by direct contact of superconducting layers of two strands of 2G ReBCO HTS CCs and pressurized splicing using partial micro-melting of superconducting layers and atoms inter-diffusion, and to a recovering of lost superconductivity, which is due to out-diffusion of oxygen atoms during splicing at high temperature, by in-diffusion of oxygen atoms during oxygenation annealing.

BACKGROUND ART

Generally, splicing between superconductors is performed in the following cases.

First, short superconductors are spliced to each other for use as a long superconductor for coiling. Second, when connecting superconductor coils, it is necessary to connect superconductor magnet coils to each other. Third, in parallel connection of superconductor permanent current switches for use in permanent current mode (PCM) operation, there is a need to splice a superconductor magnet coil and a superconductor permanent current switch.

Particularly, for superconductor-based devices inevitably designed to operate in a PCM, it is necessary to connect superconductors to function as a single superconductor having perfect continuity and uniformity (physical, chemical, and mechanical). Thus, the superconductors must be operated without any loss of superconductivity after completion of all winding operations.

For example, such splicing between superconductors is performed for superconductor magnets and superconductor-based devices, such as NMR (Nuclear Magnetic Resonance), MRI (Magnetic Resonance Imaging), SMES (Superconducting Magnet Energy Storage), MAGLEV (MAGnetic LEVitation) systems, and the like.

However, since a spliced zone between superconductors generally has inferior characteristics to non-sliced zones in various regards, a critical current (Ic) significantly depends on the spliced zone quality between the superconductors during operation in a PCM.

Thus, improvement of Ic characteristics of the spliced zone between the superconductors is essential in manufacturing of a PCM type superconductor device. However, unlike low temperature superconductors (LTSs), HTSs are formed of ceramic materials, thereby making it very difficult to maintain superconductivity with perfect continuity and uniformity after splicing.

FIG. 1 is a view of a typical 2G ReBCO HTS coated conductor (CC). Referring to FIG. 1, a typical 2G ReBCO HTS 100 is CC comprised of a high temperature superconductor material, such as ReBCO ($ReBa_2Cu_3O_{7-x}$, where Re is a rare-earth materials, and x ranges $0 \leq x \leq 0.6$), and has a laminated tape structure.

A shown in FIG. 1, the 2G ReBCO HTS CC 100 generally includes a substrate 110, a buffer layer 120, a high temperature ReBCO superconducting layer 130, and a stabilizing layer 140.

FIG. 2 schematically shows splicing methods of 2G ReBCO HTS CCs in the related art. There are two alignments, which involve 1) the direct overlap of two superconducting layers of two 2G ReBCO HTS CCs by twisting one CC by 180°, and 2) a patch using a third superconducting layers of a third piece of 2G HTS CC on top of the two superconducting layers of two 2G ReBCO HTS CCs to connect between two 2G HTS CCs aligned in parallel. The advantage of utilizing a third 2G HTS CC piece is the lack of 180° twisting of the two CCs. These two splicing configurations provide flexibility in all ranges of applications, such as stacking and arranging of 2G HTS CC magnet double pancake units.

FIG. 2(a) shows lap joint splicing in which 2G ReBCO HTS 100 are directly spliced to each other. On the other hand, FIG. 2(b) shows overlap joint splicing with butt type arrangement in which 2G ReBCO HTSs 100 are spliced via a third 2G ReBCO HTS 200. Referring to (a) and (b) of FIG. 2, generally, a solder 210 or other normal conductive layer is inserted between surfaces A of the superconductors to splice the 2G ReBCO HTSs.

However, in the superconductors spliced to each other in this manner, electric current inevitably passes through normal conductive (no-superconductive) materials such as the solder 210 and a stabilizing layer 140, which resulted in high resistance, thereby making it difficult to maintain superconductivity of 2G ReBCO HTSs. In the soldering method, a spliced zone can have a very high resistance, ranging of about 20~2800 nΩ according to the types of superconductor and splicing arrangement.

DISCLOSURE

Technical Problem

An aspect of the present invention is to provide a method of splicing two strands of 2G ReBCO HTSs, in which, with stabilizing layers removed from the two strands of 2G ReBCO HTSs through chemical wet etching or plasma dry etching, surfaces of the two high temperature superconducting layers are brought into direct contact with each other and heated in a splicing furnace in a vacuum for pressurized splicing using partial micro-melting of superconducting layers and atoms inter-diffusion, followed by solidifying the melted portions to splice the faying surfaces of the two superconductor layers to each other. Pressure to the faying surfaces of two superconducting layers during splicing promotes surface contact and the inter-diffusion of atoms between the two superconductor layers.

Another aspect of the present invention is to provide a recovering of lost superconductivity, which is due to out-diffusion of oxygen atoms during splicing at high temperature, by in-diffusion of oxygen atoms during oxygenation annealing in annealing furnace at a suitable temperature during cooling, or with the 2G HTSs reheated to a suitable temperature after completion of cooling to room temperature, by accounting for loss of superconductivity due to loss of oxygen from the 2G HTSs during splicing.

Technical Solution

In accordance with one aspect of the present invention, 2G HTSs splicing and a superconductivity recovery methods include: (a) preparing, as splicing targets, two strands of 2G HTS CCs each including a ReBCO (ReBa$_2$Cu$_3$O$_{7-x}$, where Re is a rare-earth materials, and x ranges 0≤x≤0.6); (b) forming holes in a splicing portion of each of the 2G HTS CCs; (c) etching each of the 2G HTS CCs to expose a surface of the superconducting layer for the splicing portion; (d) arranging the 2G HTS CCs such that the two exposed surfaces of the superconducting layers directly abut, or such that the two exposed surfaces of each of the superconducting layers directly abuts an exposed surface of superconducting layer of a third 2G HTS CC; (e) loading the 2G HTS CCs into a splicing furnace, with the exposed surfaces of the superconducting layers directly abutting each other, and then evacuating the splicing furnace to maintain the furnace in a vacuum; (f) increasing an inner temperature and pressure of the furnace to micro-melt the exposed surfaces of the two superconducting layers of 2G HTS CCs to allow inter-diffusion of ReBCO atoms. Pressure to the faying surfaces of two superconducting layers during splicing accelerates melting of the two superconducting layers, promotes the two surface contact, inter-diffuses of atoms between the two superconductor layers, and finally obtains uniform spliced faying surfaces; (g) annealing a spliced zone between the 2G HTS CCs under oxygen environment to supply oxygen to the ReBCO superconducting layer in each of the 2G ReBCO HTS CCs; (h) coating the spliced zone between the 2G HTS CCs with silver (Ag) so as to prevent quenching by bypassing over-current at the spliced zone between the 2G HTS CCs; and (i) reinforcing the silver-coated spliced zone between the 2G HTS CCs with a solder or an epoxy.

Advantageous Effects

In the splicing method of 2G HTS CCs according to the present invention, only the superconducting layer materials are subjected to partial micro-melting and atoms inter-diffusion with pressure, splicing and solidification, with the direct face-to-face contact of two or three exposed superconducting layers each other without inserting mediums such as a solder or a filler between 2G HTS CCs, whereby a sufficiently long 2G HTS CC capable of being used for operation in a PCM can be fabricated substantially without resistance in a spliced zone, as compared with conventional normal splicing.

Particularly, in the splicing method of 2G HTS CCs according to the present invention, the 2G HTS CCs are subjected to hole-drilling before splicing, thereby providing an oxygen in-diffusion path towards the ReBCO superconducting layers during oxygenation annealing for replenishment of lost oxygen after splicing. As a result, it is possible to reduce annealing duration for replenishing oxygen, and to provide excellent superconductivity after splicing the 2G HTS CCs.

DESCRIPTION OF DRAWINGS

FIG. 1 is a view of a general 2G HTS CCs structure.
FIG. 2 schematically shows examples of a conventional method of soldering 2G HTS CCs.
FIG. 4(a) shows one example of hole-drilling in which holes are formed through a substrate so as not to reach a superconductor layer,
and FIG. 4(b) shows another example of hole-drilling in which holes are formed through a 2G ReBCO HTS CC from a substrate to a stabilizing layer.
FIG. 5 is a view of a 2G ReBCO HTS CC, from which a stabilizing layer is removed, after hole-drilling.
FIG. 6 shows one example of lap joint splicing, in which 2G ReBCO HTS CCs are spliced to each other by lap type arrangement after hole-fabrication 2G HTS CCs and removing stabilizing layers.
FIG. 7 shows one example of overlap joint splicing with butt type arrangement, in which a third 2G ReBCO HTS CC piece with removed stabilizing layer is spliced to two 2G ReBCO HTS CCs with removed stabilizing layer in butt type arrangement by overlap splicing, after-fabrication, respectively.
FIG. 8 shows a top view of a 2G ReBCO HTS CC after-fabrication.
FIG. 13 is a graph depicting the current-voltage characteristics of the Type II 2G ReBCO HTS CC (holes are formed throughout the overall thickness of the superconductor from the substrate to the stabilizing layer) according to variation of hole pitch. The Type II 2G ReBCO HTS CC also exhibits similar electrical characteristics to original 2G HTS CC at $d_v$=500 μm and $d_h$=500 on.

BEST MODE

Now, a splicing method of 2G ReBCO HTS exhibiting excellent superconductivity by direct contact of superconducting layers of two strands of 2G ReBCO HTS and pressurized splicing using partial micro-melting of superconducting layers and atoms inter-diffusion, and to a recovering of lost superconductivity, which is due to out-diffusion of oxygen atoms during splicing at high temperature, by in-diffusion of oxygen atoms during oxygenation annealing will be described in detail.

Figure 3:
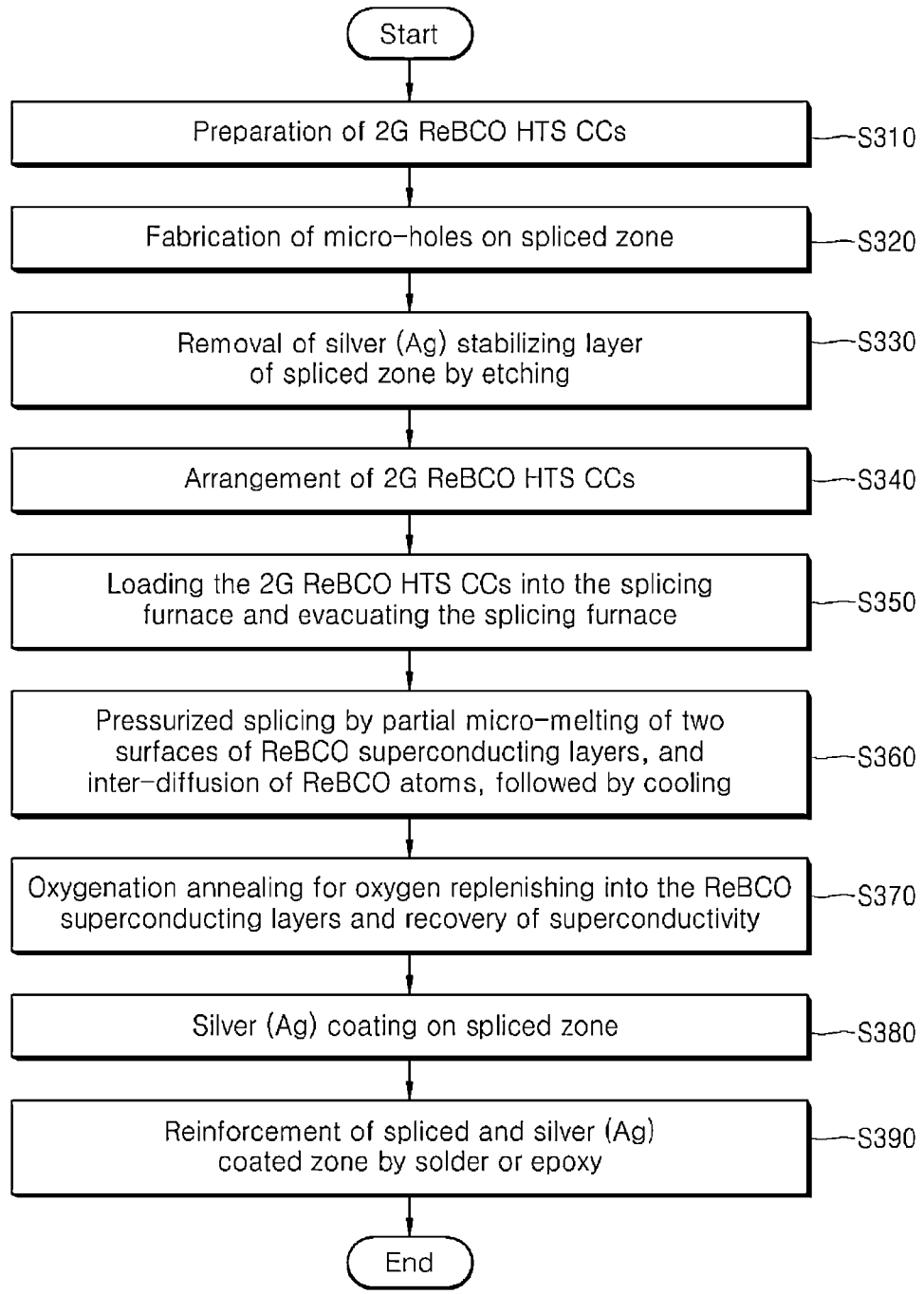
FIG. 3 is a schematic flowchart of a splicing with pressure by partial micro-melting of superconducting layers and atoms inter-diffusion of 2G ReBCO HTS CCs and a recovering of lost superconductivity by in-diffusion of oxygen atoms during oxygenation annealing in accordance with one embodiment of the present invention.

FIG. 3 is a schematic flowchart of a pressurized splicing of 2G ReBCO HTS exhibiting excellent superconductivity by direct contact of superconducting layers of two strands of 2G ReBCO HTS using partial micro-melting of superconducting layers and atoms inter-diffusion, and to a recovering of lost superconductivity, which is due to out-diffusion of oxygen atoms during splicing at high temperature, by in-diffusion of oxygen atoms during oxygenation annealing.

Referring to FIG. 3, the splicing method of 2G ReBCO HTS CC includes preparing 2G ReBCO HTS CC (S310), hole-fabrication to form holes for supplying oxygen to a spliced zone (S320), removing a stabilizing layer by etching (S330), arranging the 2G ReBCO HTS CCs (lap or butt and overlap) according to splicing type, loading the 2G ReBCO HTS CCs into a splicing furnace and evacuating the furnace (S350), performing partial micro-melt diffusion pressurization splicing of surfaces of two superconducting layers (S360), annealing the superconducting layers for oxygen replenishment (S370), silver (Ag) coating (S380), and reinforcing a spliced and silver (Ag) coated zone (S390).

Preparation of 2G ReBCO HTS CCs

First, in preparation of 2G ReBCO HTS CCs (S310), each including a ReBCO (ReBa$_2$Cu$_3$O$_{7-x}$, where Re is a rare-earth materials, x ranges 0≤x≤0.6), are prepared.

FIG. 4 shows examples of hole-fabrication in a splicing portion between 2G ReBCO HTS CCs described below. These examples will be referred to in description of the structure of the 2G ReBCO HTS CCs.

Referring to FIG. 4, a 2G ReBCO HTS CCs 400 includes a conductive substrate 410, a buffer layer 420, a ReBCO high temperature superconducting layer 430, and a stabilizing layer 440.

The conductive substrate 410 may be formed of a metallic material such as Ni or Ni alloys, and may be formed into a cube texture through rolling and heat treatment.

The buffer layer 420 may be formed of a material including at least one selected from ZrO$_2$, CeO$_2$, YSZ (yttrium-stabilized zirconia), Y$_2$O$_3$, HfO$_2$, and the like. The buffer layer may be formed as a single layer or multiple layers on the conductive substrate 410 through epitaxial lamination.

The ReBCO high temperature superconducting layer 430 is composed of superconductive ReBCO (ReBa$_2$Cu$_3$O$_{7-x}$, where Re is a rare-earth materials, x ranges 0≤x≤0.6). Advantageously, the molar ratio of Re:Ba:Cu is 1:2:3, and the molar ratio (7-x) of oxygen to the rare earth materials is 6.4. In ReBCO, if the molar ratio of oxygen to 1 mole of rare-earth materials is less than 6.4, ReBCO may act as a normal conductor due to loss of superconductivity.

Among the materials constituting ReBCO, one example of the rare-earth materials (Re) is yttrium (Y). Additionally, Nd, Gd, Eu, Sm, Er, Yb, Tb, Dy, Ho, Tm and the like may be used as the rare-earth materials.

The stabilizing layer 440 is stacked on an upper surface of the ReBCO high temperature superconducting layer 430 to provide electrical stabilization of the superconducting layer 430 by protecting the superconducting layer 430 from over-current, and the like. The stabilizing layer 440 is formed of a metallic material with relatively low electrical resistance to protect the superconducting layer 430 when over-current flows therethrough. For example, the stabilizing layer may be formed of a metallic material with relatively low electrical resistance such as silver (Ag) or copper (Cu). In some embodiments, the stabilizing layer may be formed of stainless steel.

Hole-Fabrication in Splicing Portion

Next, in hole-fabrication in a splicing portion (S320), a portion of each of the 2G ReBCO HTS CCs to be spliced, that is, micro-holes at splicing portion of each of the 2G ReBCO HTS CCs are formed 450. Hole-fabrication may be carried via high-precision machining, laser machining, or the like.

The holes provide oxygen in-diffusion paths to the ReBCO high temperature superconducting layers 430 in an annealing stage for oxygen replenishment to ReBCO(S370) so as to improve annealing efficiency, thereby allowing the superconductors to maintain superconductivity while reducing an annealing time.

Referring to FIG. 4, hole-fabrication may be performed to penetrate through the substrate 410 of the 2G HTS ReBCO CCs so as not to reach the superconducting layer (Type I of FIG. 4(a)), or may be performed to penetrate through the 2G HTS ReBCO CCs from the substrate 410 to the stabilizing layer 440 (Type II of FIG. 4(b)).

FIG. 5 shows a surface of a superconducting layer after hole-fabrication.

Figure 9:
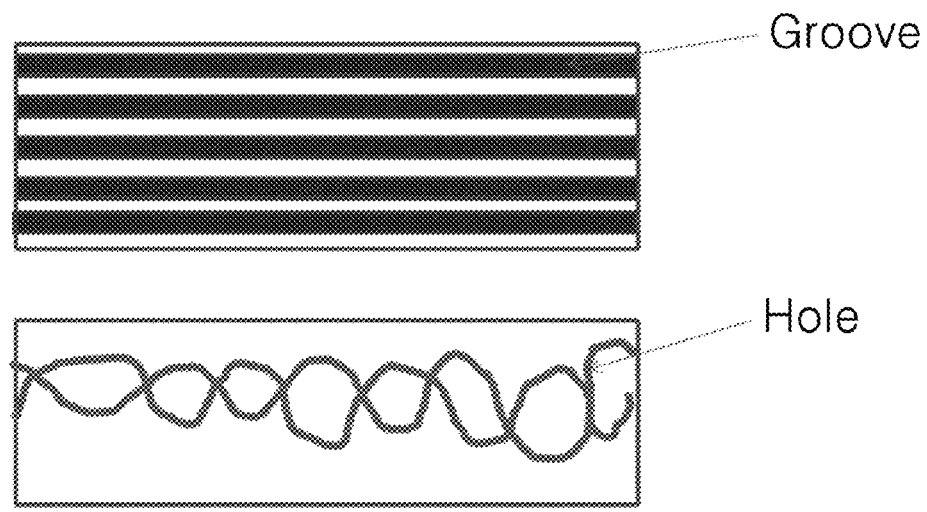
FIG. 9 shows top views of a 2G ReBCO HTS CC after-fabrication in various patterns.

FIG. 8 is a top view of a 2G ReBCO HTS CC in which holes are formed in a vertical direction, that is, in a thickness direction of the CC, and FIGS. 9 (a) and (b) are top views of 2G ReBCO HTS CC in which holes are formed in various patterns, in which FIG. 9(a) is a top view of a 2G ReBCO HTS CC in which cylindrical holes are formed in a longitudinal direction of the CC, that is, along the length of the CC, and FIG. 9 (b) is a top view of a 2G ReBCO HTS CC, in which holes are randomly formed. As shown in FIG. 8 and FIG. 9, the holes are formed to aid in flow and diffusion of oxygen and may be formed in various shapes, sizes, and pitches.

Figure 11:
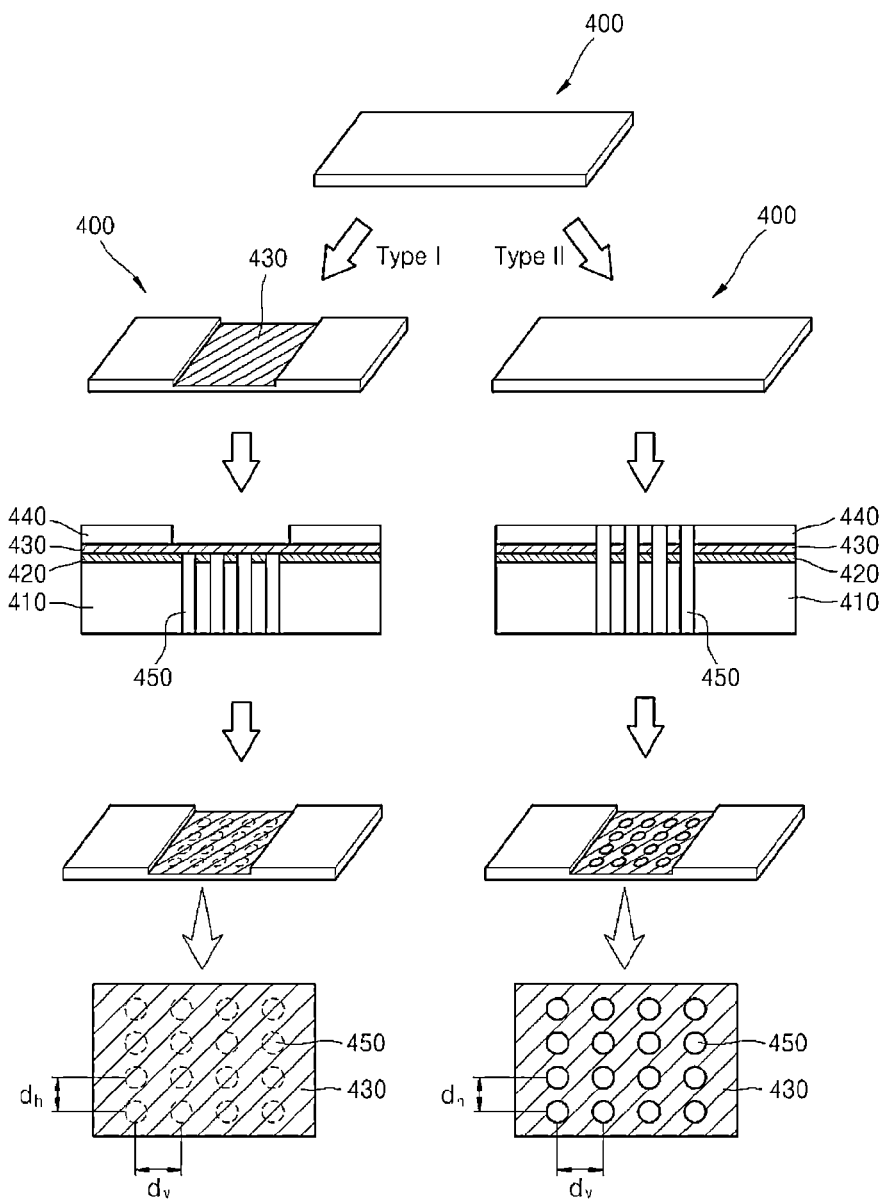
FIG. 11 is flow diagrams of a-fabrication processes in a 2G ReBCO HTS CC, showing a vertical hole pitch ($d_v$) and a horizontal hole pitch ($d_h$).

FIG. 11 shows hole-fabrication processes, in which hole pitches are represented by vertical hole pitch x horizontal hole pitch (d$_v$×d$_h$), and FIGS. 12 to 15 are graphs depicting current-voltage characteristics of ReBCO after hole-fabrication.

In FIG. 11, a left view shows Type I in which hole-fabrication in the splicing portion is performed such that holes penetrate a substrate 410 and do not reach a superconductor layer in the CC, and a right view shows Type II in which hole-fabrication in the splicing portion is performed such that holes are formed to penetrate the 2G ReBCO HTS CC from the substrate 410 to the stabilizing layer 440.

Figure 12:
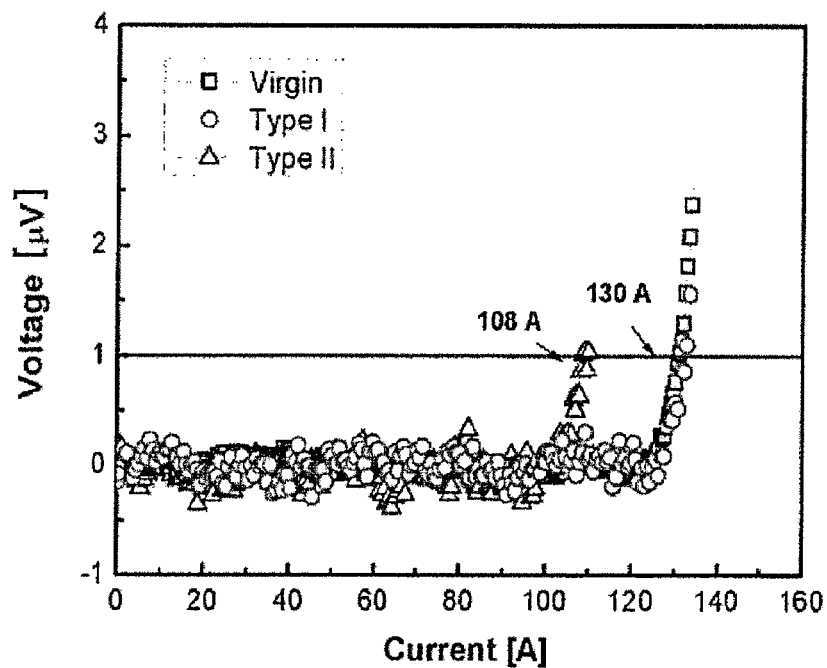
FIG. 12 is a graph depicting current-voltage characteristics of Type I and II 2G ReBCO HTS CCs (Type I: holes are formed through a substrate so as not to reach a superconductor layer, Type II: holes are formed in the thickness direction of the superconductor from the substrate to the stabilizing layer) by a four-probe method when holes are formed to have a vertical hole pitch $d_v$ of 400 μm and a horizontal hole pitch $d_h$ of 400 μm. At a 1 μV/cm criteria of Ic, the Type 12G ReBCO HTS CC has a Ic of 130 A, which is similar to the electrical characteristics of an original 2G ReBCO HTS CCs, and the Type II 2G ReBCO HTS CC has a Ic of 108 A.

Referring to FIG. 12, both Type I and Type II superconductors clearly exhibit substantially almost the same current-voltage characteristics as those of ReBCO (Virgin) in which holes are not formed. In particular, the Type I superconductor having the holes formed through the substrate so as not to reach the superconductor layer exhibits current-voltage characteristics more similar to those of the original ReBCO.

Figure 13:
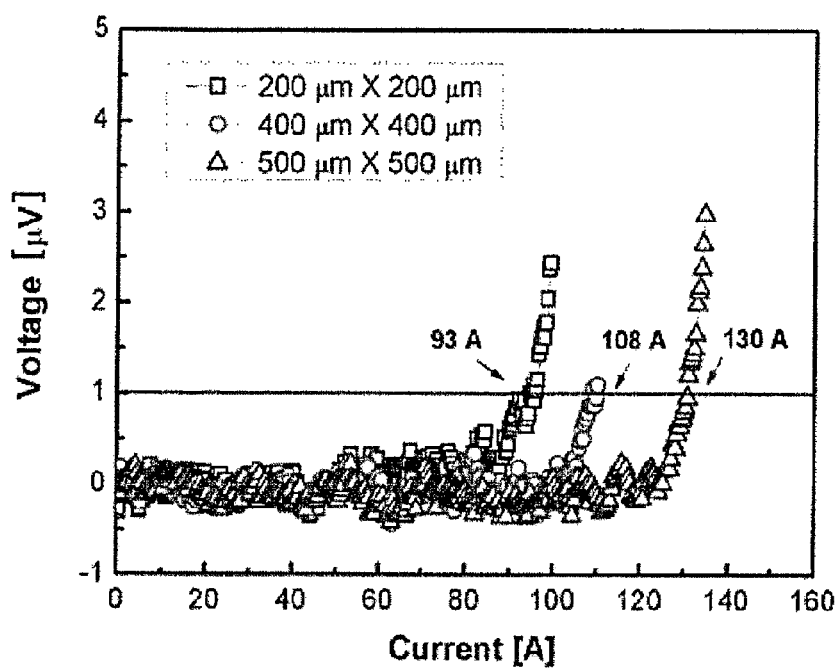

FIG. 13 is a graph depicting current-voltage characteristics of 2G ReBCO HTS CC according to micro-hole pitches. For evaluation of the current-voltage characteristics, the vertical hole pitch $d_v$ and the horizontal hole pitch $d_h$ were variously set to, for example, 200 μm×200 μm, 400 μm×400 μm, 500 μm×500 μm, and the like. Referring to FIG. 13, the current-voltage characteristics were improved with increasing pitch between micro-holes 450 formed by fabrication. Particularly, when the pitch between the micro-holes was 500 μm, the superconductor exhibited superior current-voltage characteristics to the superconductors in other cases.

Figure 14:
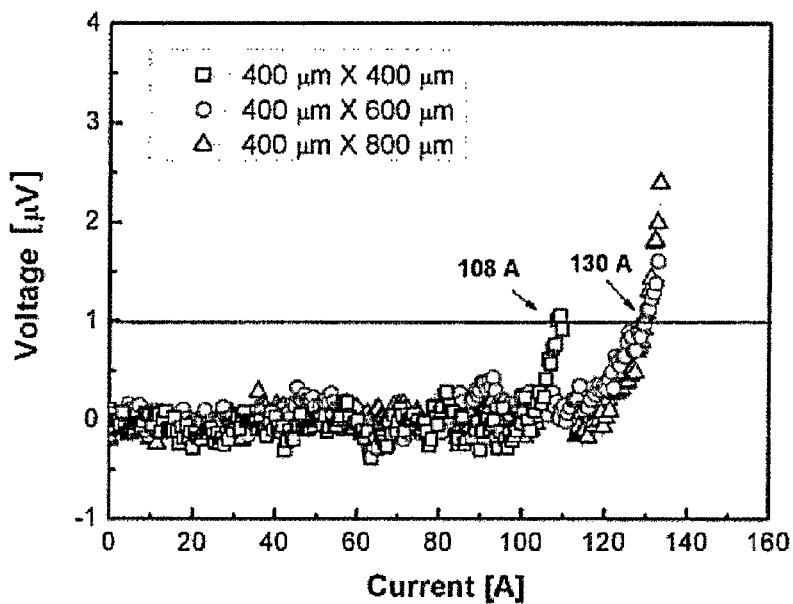
FIG. 14 is a graph depicting the current-voltage characteristics of the Type II 2G ReBCO HTS CC according to variation of the horizontal hole pitch $d_h$ with the vertical hole pitch $d_v$ set to 400 on. At horizontal hole pitches $d_h$ of 600 μm and 800 μm, the Type II 2G ReBCO HTS CC exhibited similar critical current characteristics to those of the original 2G ReBCO HTS CC.

FIG. 14 is a graph depicting current-voltage characteristics of 2G ReBCO HTS CC according to the vertical hole pitch and the horizontal hole pitch. For evaluation of the current-voltage characteristics, the vertical hole pitch and the horizontal hole pitch were variously set to, for example, 400 μm×400 μm, 400 μm×600 μm, and 400 μm×800 μm.

Referring to FIG. 14, the current-voltage characteristics of the 2G ReBCO HTS CC were improved with increasing horizontal pitch between the micro-holes 450.

Figure 15:
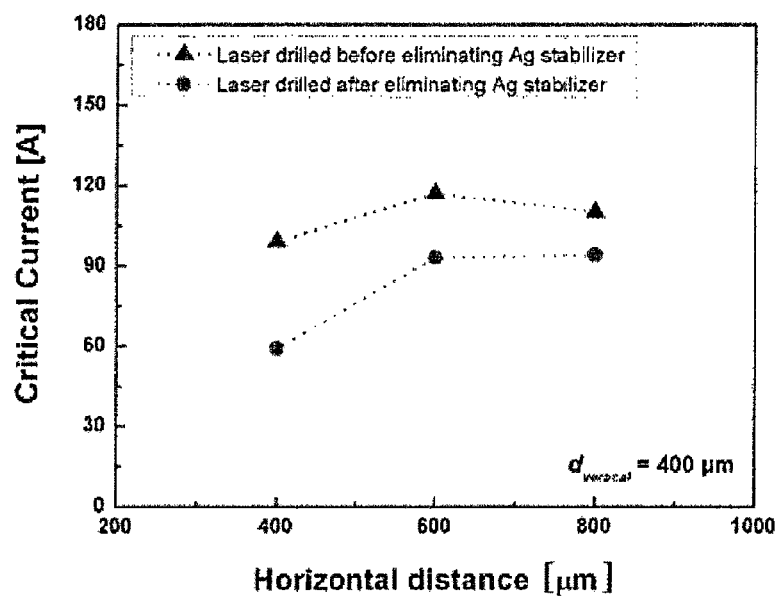
FIG. 15 is a graph depicting current-voltage characteristics of Type II 2G ReBCO HTS CC subjected to hole-fabrication before and after etching. Hole-fabrication before etching is advantageous in terms of Ic, and particularly, the superconductor exhibits superior electrical characteristics at $d_v$=400 μm and $d_h$=600 μm.

FIG. 15 is a graph depicting current-voltage characteristics of 2G ReBCO HTS CC subjected to hole-fabrication before and after etching. With the vertical hole pitch $d_v$ of the 2G ReBCO HTS CC set to 400 μm, the current characteristics of the 2G ReBCO HTS CC were evaluated by changing the horizontal hole pitch ($d_h$) to 400 μm, 600 μm and 800 μm.

Referring to FIG. 15, it can be seen that the 2G ReBCO HTS CC subjected to hole-fabrication before etching for removal of the stabilizing layer exhibits superior current characteristics to those of the 2G ReBCO HTS CC subjected to hole-fabrication after etching for removal of the stabilizing layer under the same conditions. Accordingly, hole-fabrication before removal of the stabilizing layer is more advantageous.

Figure 16:
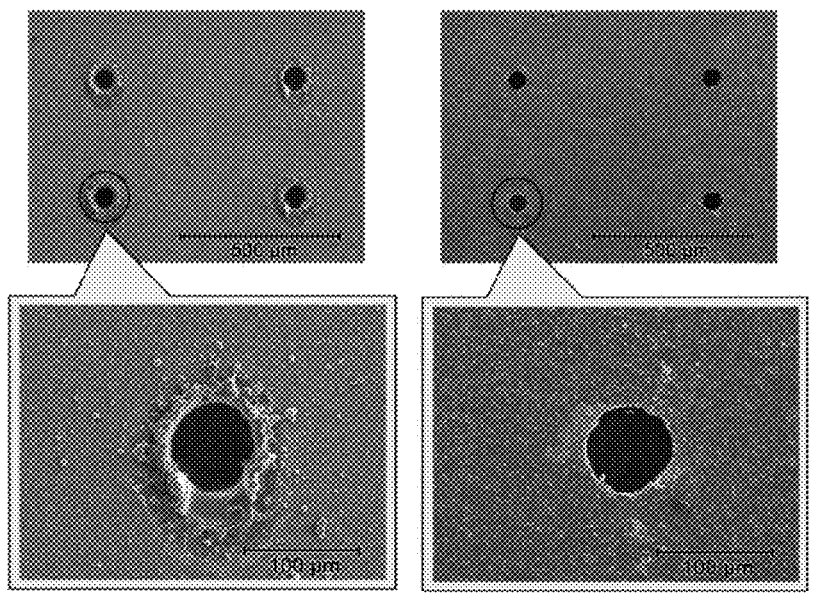
FIG. 16 shows pictures of surfaces of 2G ReBCO HTS CC subjected to laser hole-fabrication before removal of an Ag stabilizing layer (left side of FIG. 16) and after removal of the Ag stabilizing layer (right side of FIG. 16).

FIG. 16 shows pictures of surfaces of 2G ReBCO HTS CC subjected to laser hole-fabrication before removal of an Ag stabilizing layer (left side of FIG. 16) and after removal of the Ag stabilizing layer (right side of FIG. 16).

Referring to FIG. 16, it can be seen that laser hole-fabrication after removal of the Ag stabilizing layer provides a cleaner surface.

Figure 17:
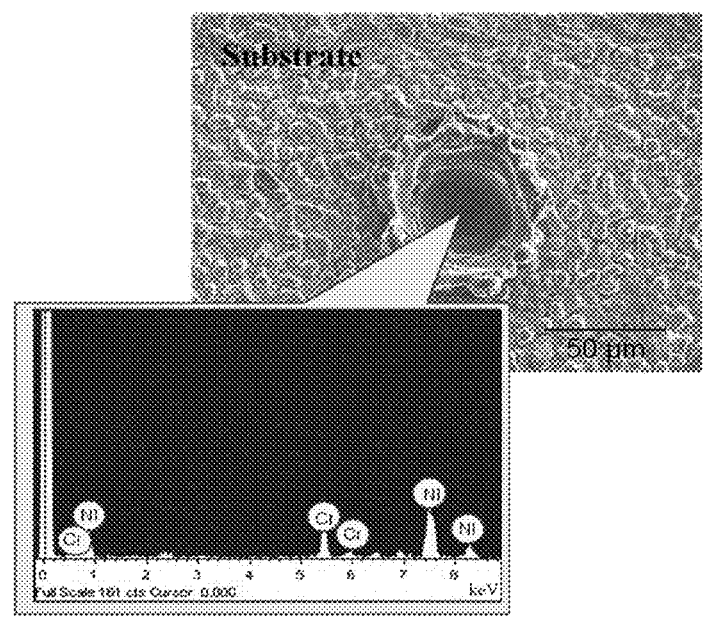
FIG. 17 shows an SEM image and an EDX analysis of a surface of a Type I 2G ReBCO HTS CC subjected to hole-fabrication to form holes penetrating a substrate so as not to reach a superconductor layer.

FIG. 17 shows an SEM image and an EDX analysis of a surface of a superconductor sample subjected to hole-fabrication to form holes penetrating a substrate so as not to reach a superconductor layer.

Referring to FIG. 17, it can be seen that the substrate is comprised of nickel and a nickel alloy.

Removal of Stabilizing Layer Through Etching

Then, in removal of the stabilizing layer through etching (S330), the stabilizing layer of the 2G ReBCO HTS CC is etched to expose the ReBCO high temperature superconducting layer.

In the 2G ReBCO HTS CC, since ReBCO is placed inside the CC, the stabilizing layer is removed by etching to expose the ReBCO high temperature superconducting layer thereof in order to splice the ReBCO high temperature superconducting layers through direct contact therebetween.

When etching the stabilizing layer, a resist having selective etching capability with respect to the stabilizing layer or a resist having opposite etching capability may be used.

Arrangement of 2G ReBCO HTS CCs According to Splicing Type (Lap Joint or Butt & Overlap)

In this operation (S340), the 2G ReBCO HTS CCs are arranged according to the splicing types, that is, lap joint splicing (FIG. 6), or overlap joint splicing with butt type arrangement in which two strands of the CCs are disposed in butt arrangement and a third CC is disposed to overlap the two CCs (FIG. 7). FIG. 6 and FIG. 7 show the 2G ReBCO HTS CCs after forming holes therein.

In FIGS. 6 and 7, (a) shows Type I 2G ReBCO HTS CCs in which hole-fabrication is performed through the substrate 410 so as not to reach the superconducting layer, and (b) shows Type II 2G ReBCO HTS CCs in which hole-fabrication is performed through the CC from the substrate 410 and the stabilizing layer 440.

Evacuation of Splicing Furnace after Loading 2G ReBCO HTS CCs in Splicing Furnace After arranging the 2G ReBCO HTS CCs in a predetermined manner, the CCs are placed in a joining furnace, followed by evacuation of the furnace to a certain level of vacuum.

The furnace may be evacuated to a pressure of $PO_2 \leq 10^{-5}$ mTorr.

Figure 10:
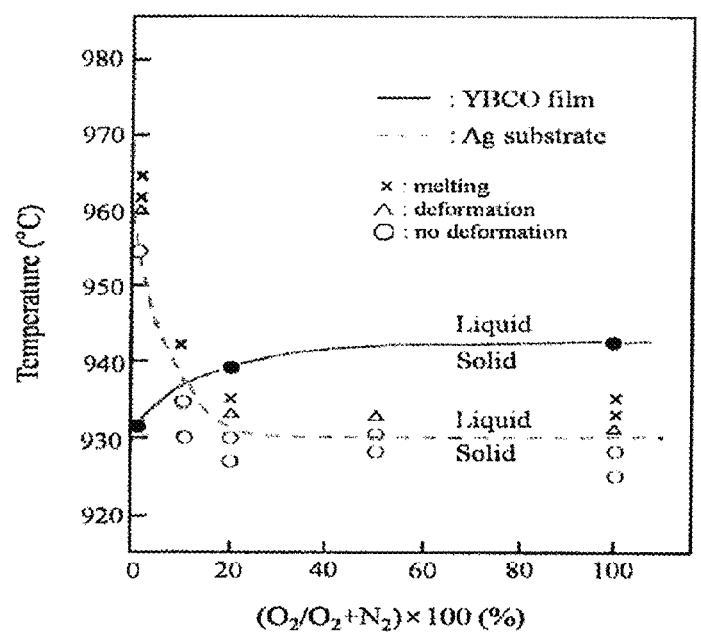
FIG. 10 is a graph depicting variation of melting points of YBCO and Ag according to partial pressure of oxygen.

Evacuation of the furnace is carried out in order to allow only ReBCO to be melted and spliced by partial micro-melting and atoms inter-diffusion with pressurization of the ReBCO. Referring to FIG. 10, at a very low partial pressure of oxygen, silver (Ag) constituting the stabilizing layer has a higher melting point than ReBCO constituting the superconductor layer, allowing only ReBCO to be melted.

The furnace may be any type of furnace such as a direct contact heating furnace, an induction heating furnace, a microwave heating furnace, or other furnace heating types.

When the furnace is a direct heating, a ceramic heater may be used. In this case, heat is directly transferred from the ceramic heater to the 2G ReBCO HTS CCs and splicing the CCs.

When the furnace is an indirect heating, an induction heater may be used. In this case, the 2G ReBCO HTS CCs may be heated through indirect heating. In addition, the 2G ReBCO HTS CCs may be heated in a non-contact manner using microwaves.

Partial Micro-Melting Diffusion Pressurization Splicing of ReBCO High Temperature Superconducting Layers Through Direct Contact In this operation (S360), with two ReBCO high temperature superconducting layers (in lap joint splicing) or three ReBCO high temperature superconducting layers (in overlap joint splicing with butt type arrangement using a third ReBCO high temperature superconductor piece) splicing each other, the ReBCO superconducting layers are partially micro-melted by heating the ReBCO layers to near a melting point of ReBCO to allow partial melting and inter-diffusion of atoms, followed by cooling.

Then, pressure is additionally applied to the 2G ReBCO HTS CCs to promote face-to-face contacts between the ReBCO superconducting layers, partial melting of two or three faying surfaces of ReBCO superconducting layers and inter-diffusion of atoms, and to remove various flaws such as vacancies or the like from the splicing portion while increasing a contact area. When pressure is applied to the 2G ReBCO HTS CCs, thermal densities at the ReBCO micro-protrudes from the surfaces of the superconducting layers increase, thereby allowing the ReBCO high temperature superconducting layers to be melted less of the ReBCO melting point. Thus, it is possible to decrease an actual temperature for partial micro-melting and diffusion splicing under pressure. Even in this case, however, the inner temperature of the furnace is set to a predetermined temperature or more to ensure that the two superconducting layers (or three superconducting layers according to joint type arrangements) are sufficiently melted and spliced, and a spliced zone has sufficient strength after solidification. If the inner temperature of the furnace is less than 400° C., undesirable splicing may be encountered. Thus, advantageously, the furnace is set to an inner temperature of 400° C. or more. In addition, if the inner temperature of the furnace exceeds 1100° C., silver (Ag) constituting the stabilizing layer can also be melted even under a vacuum. Thus, advantageously, during partial micro-melting inter-diffusion pressurization splicing, the furnace is set to have an inner temperature of 1100° C. or less.

Pressurization may be performed by a weight or an air cylinder. A force of 0.1~30 MPa may be used for pressurization. If the force is less than 0.1 MPa, pressurization can be insufficient. On the other hand, if the force exceeds 30 MPa, there can be a problem of deterioration in stabilization of the 2G ReBCO HTS CCs.

A high temperature superconductor such as ReBCO exhibits higher critical current characteristics when crystals are grown to have a certain orientation. Thus, the present invention employs partial micro-melting diffusion pressurization splicing capable of maintaining a crystal orientation of a matrix in the spliced zone to permit epitaxial solidification.

In the method of the present invention, since the ReBCO superconducting layers of the 2G ReBCO HTS CCs are brought into direct contact with each other and subjected to partial micro-melting diffusion pressurization splicing, a normal conduction layer such as a solder or a filler is not present between the 2G ReBCO HTS CCs, thereby preventing generation of Joule heat or quenching due to junction resistance in the spliced zone.

Splicing of the 2G ReBCO HTS CCs may be carried out by lap joint splicing as shown in FIG. 6, or by overlap joint splicing with butt type arrangement as shown in FIG. 7.

In lap joint splicing as shown in FIG. 6, with splicing surfaces of two ReBCO superconducting layers 400a, 400b to be spliced, that is, exposed surfaces of the ReBCO superconducting layers, disposed to face each other, the ReBCO superconducting layers are directly subjected to splicing by partial micro-melting and inter-diffusion of ReBCO atoms by pressurization, followed by solidification.

On the other hand, in overlap joint splicing with butt type arrangement, as shown in FIG. 7, distal ends of two ReBCO superconducting layers 400a, 400b to be spliced are brought into contact in butt arrangement or separated a predetermined distance from each other.

In this state, a separate small piece of third 2G ReBCO HTS CCs 400c, from which a stabilizing layer is removed, is placed on the two 2G ReBCO HTS CCs, 400a, from which a stabilizing layer is removed, 400b. Then, direct partial micro-melting diffusion pressurization splicing is performed with respect to three ReBCO high temperature superconducting layers while compressing the splicing portions of the 2G ReBCO HTS CCs by applying a load thereto.

In lap joint splicing, the ReBCO superconducting layer of one 2G ReBCO HTS CCs adjoins the ReBCO superconducting layer of one 2G ReBCO HTS CCs in lap arrangement.

On the other hand, for partial micro-melting diffusion pressurization splicing of ReBCO, it is desirable that the interior of the splicing furnace be designed to permit adjustment of the partial pressure of oxygen ($PO_2$) in various ranges under vacuum.

FIG. 10 is a graph depicting variation of melting points of YBCO and Ag according to the partial pressure of oxygen. Referring to FIG. 10, when nitrogen and oxygen are mixed and the volume fraction of oxygen is 10% or more of the total volume of the mixture, or pure oxygen pressure is about 75 Torr or more in the furnace, the melting point of YBCO that is a type of ReBCO is higher than Ag for the stabilizing layer. In this case, upon partial micro-melting diffusion splicing of YBCO, Ag is melted prior to YBCO, thereby causing deformation or contamination of the stabilizing layer.

On the contrary, when the volume fraction of oxygen is less than 10% or pure oxygen pressure is less than about 75 Torr, the melting point of Ag is higher than that of YBCO, thereby minimizing problems caused by melting of Ag during partial micro-melting diffusion of YB CO.

Annealing Treatment for Replenishment of Oxygen to ReBCO High Temperature Superconducting Layer In this operation (S370), the spliced zone of the ReBCO high temperature superconducting layers is subjected to annealing under an oxygen atmosphere. The operation of partial micro-melting diffusion pressurization splicing (S360) is performed in a vacuum at a high temperature of 400° C. or more. However, in the vacuum and high temperature conditions, oxygen ($O_2$) escapes from the ReBCO superconducting layer.

As oxygen escapes from the ReBCO, the molar ratio of oxygen to 1 mole of the rare-earth materials can be decreased below 6.4. In this case, the ReBCO high temperature superconducting layers 430 can undergo phase transformation from an orthorhombic structure of a superconductor to a tetragonal structure of a normal conductor, and thus can lose superconductivity.

To solve such a problem, in this annealing operation (S370), while pressurizing at 200~700° C., annealing is performed under the oxygen atmosphere to compensate for oxygen loss in ReBCO, thereby recovering superconductivity.

Figure 18:
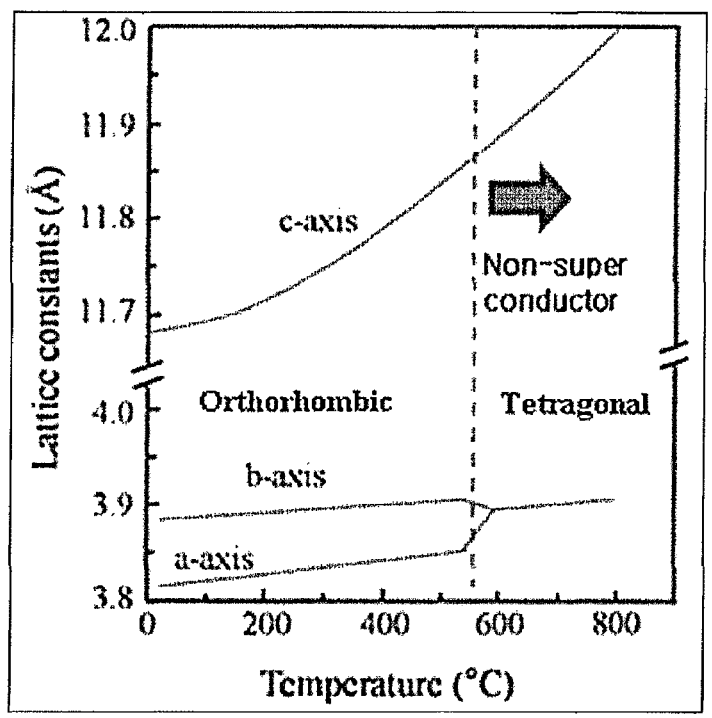
FIG. 18 shows a lattice change of a 2G ReBCO HTS CC according to temperature. The lattice distance of each axis increases together with temperature increase, and in particular, at temperatures of about 550° C. or more, the ReBCO superconductor undergoes transformation of an atom arrangement structure from an orthorhombic structure of a superconductor to a tetragonal structure of a normal conductor.

The oxygen atmosphere may be created by continuously supplying oxygen to the annealing furnace while pressurizing the furnace. This process is referred to as oxygenation annealing. In particular, oxygenation annealing is performed in a temperature range of 200~700° C. This temperature range provides the most stable orthorhombic phase recovering superconductivity, as can be seen from FIG. 18.

If a low pressure is applied to the spliced zone upon annealing, there can be a problem in oxygen supply, and if a high pressure is applied thereto, durability of the superconductor can be adversely affected by the high force. Thus, the annealing furnace may have a pressure of about 1~30 atm during annealing.

Since annealing is performed for replenishment of oxygen lost by partial micro-melting diffusion pressurization splicing, annealing may be performed until the molar ratio of oxygen ($O_2$) to 1 mole of Re (rare-earth materials) in ReBCO becomes 6.4~7.

According to the present invention, the micro holes 450 are formed in the 2G ReBCO HTS CCs by hole-fabrication in the splicing portion (S320), thereby providing a path for diffusion of oxygen into the ReBCO high temperature superconducting layer during annealing. As a result, it is possible to shorten an annealing time for superconductivity recovery of the 2G ReBCO HTS CCs. As described above, in the partial micro-melting diffusion pressurization splicing method of the 2G ReBCO HTS CCs according to the present invention, the micro holes are previously formed in the splicing portion before splicing of the 2G ReBCO HTS CCs to provide the diffusion path of oxygen into the ReBCO high temperature superconducting layers during annealing, thereby shortening the annealing time while maintaining superconductivity after splicing.

Figure 19:
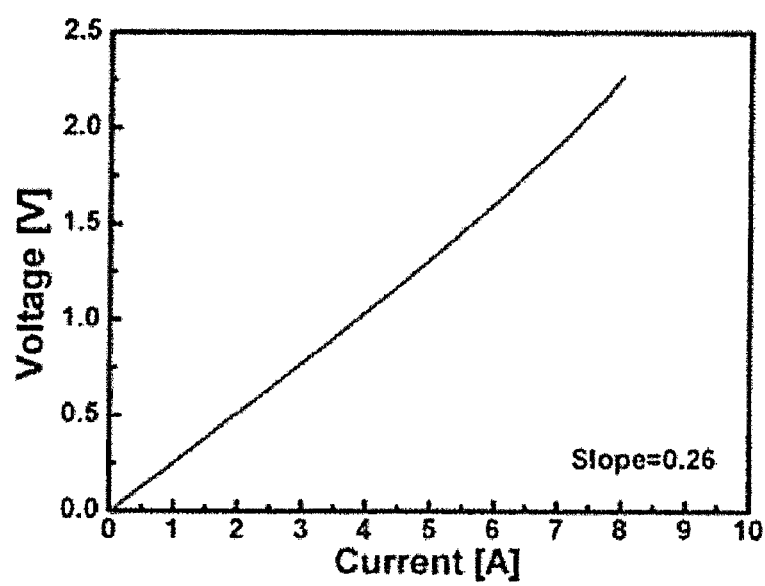
FIG. 19 is a graph depicting V-I characteristics after splicing, showing complete normal conductivity.
Figure 20:
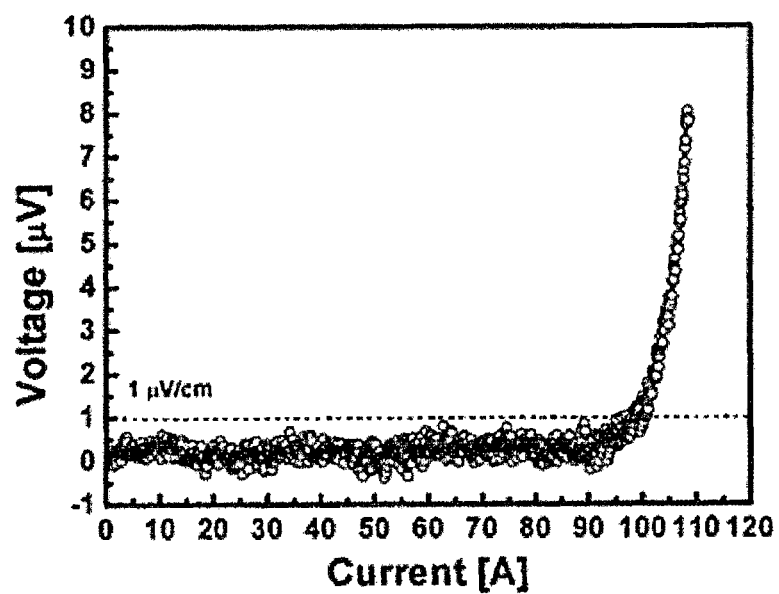
FIG. 20 is a graph depicting V-I characteristics after oxygenation annealing, as measured by a 4-probe method, showing recovery of superconductivity.

FIG. 19 is a graph depicting V-I characteristics after splicing, and FIG. 20 is a graph depicting V-I characteristics after oxygenation annealing.

In FIGS. 19 and 20, it can be seen that the superconductors lose superconductivity and exhibit ohmic characteristics after splicing (FIG. 19), and recover superconductivity after annealing (FIG. 20).

Silver (Ab) Coating of Spliced Zone of 2G ReBCO HTS CCs

After partial micro-melting diffusion splicing of the 2G ReBCO HTS CCs, the spliced zone does not include the silver (Ag) stabilizing layer. Thus, when over-current flows to the spliced zone, the over-current does not bypass the spliced zone, thereby causing quenching.

To prevent such a problem, silver (Ag) coating is performed with respect to the spliced zone of the 2G ReBCO HTS CCs and surroundings thereof.

Advantageously, silver (Ag) coating is performed to a thickness of 2~40 μm. If the thickness of the silver (Ag) coating layer is less than 2 μm, over-current bypassing becomes insufficient even after silver (Ag) coating. On the contrary, if the thickness of the silver (Ag) coating layer exceeds 40 μm, splicing cost increases without additional effects.

Reinforcement of Spliced Zone of 2G ReBCO HTS CCs Using Soldering or Epoxy

After silver (Ag) coating the spliced zone of the 2G ReBCO HTS CCs, the spliced zone of the 2G ReBCO HTS CCs is reinforced using a solder or an epoxy in order to protect the spliced zone from external stress.

As described above, the method according to the present invention employs partial micro-melting diffusion pressurization splicing of ReBCO high temperature superconducting layers through direct contact thereof, and includes hole-fabrication in a spliced zone of the 2G ReBCO HTS CCs, thereby improving splicing efficiency while ensuring superconductivity after splicing.

Although some embodiments have been described herein with reference to the accompanying drawings, it will be understood by those skilled in the art that these embodiments are provided for illustration only, and various modifications, changes, alterations and equivalent embodiments can be made without departing from the scope of the present invention. Therefore, the scope and sprit of the present invention should be defined only by the accompanying claims and equivalents thereof.

The invention claimed is:

1. A method of splicing second generation Rare-Earth Barium Copper Oxide high temperature superconductor coated conductors (2G ReBCO HTS CCs) and superconductivity recovery through oxygenation annealing of 2G ReBCO HTS CCs, the method comprising:
   (a) preparing, as splicing targets, two strands of 2G HTS CCs each including a ReBCO (ReBa$_2$Cu$_3$O$_{7-x}$, where Re is a rare-earth material, and $0 \leq x \leq 0.6$) high temperature superconducting layer;
   (b) forming holes in a splicing portion of each of the 2G ReBCO HTS CCs;
   (c) etching each of the 2G ReBCO HTS CCs to expose a surface of the ReBCO high temperature superconducting layer in the splicing portion of the 2G ReBCO HTS CCs;
   (d) arranging the 2G ReBCO HTS CCs such that the exposed surfaces of the ReBCO high temperature superconducting layers directly abut each other, or such that the exposed surface of each of the ReBCO high temperature superconducting layers directly abuts an exposed surface of a ReBCO high temperature superconducting layer of a third 2G ReBCO HTS CCs;
   (e) loading the 2G ReBCO HTS CCs into a splicing furnace, with the exposed surfaces of the ReBCO high temperature superconducting layers directly abutting each other, followed by maintaining the furnace in a vacuum;
   (f) increasing an inner temperature of the furnace for micro-melting of the exposed surfaces of the ReBCO high temperature superconducting layers, inter-diffusion of ReBCO atoms, and splicing the ReBCO layers of the 2G ReBCO HTS CCs;
   (g) annealing the 2G ReBCO HTS CCs under oxygen atmosphere to supply oxygen to the ReBCO high temperature superconducting layers in each of the 2G ReBCO HTS CCs;
   (h) coating the spliced zone of the 2G ReBCO HTS CCs with silver (Ag) so as to prevent quenching by bypassing over-current at the spliced zone between the 2G ReBCO HTS CCs; and
   (i) reinforcing the spliced and silver (Ag)-coated zone of the 2G ReBCO HTS CCs with a solder or an epoxy.

2. The method according to claim 1, wherein the 2G ReBCO HTS CCs comprise:
   a conductive substrate;
   at least one buffer layer formed on the conductive substrate;
   a ReBCO high temperature superconducting layer formed on the buffer layer; and
   a stabilizing layer formed on the ReBCO high temperature superconducting layer to electrically stabilize the ReBCO high temperature superconducting layer.

3. The method according to claim 2, wherein
   the substrate comprises nickel (Ni) or a nickel (Ni) alloy,
   the buffer layer comprises at least one selected from the group consisting of $ZrO_2$, $CeO_2$, YSZ (yttrium-stabilized zirconia), $Y_2O_3$, $HfO_2$, and $Al_2O_3$, and
   the stabilizing layer comprises at least one selected from the group consisting of silver (Ag), copper (Cu) and stainless steel.

4. The method according to claim 2, wherein the ReBCO high temperature superconducting layer comprises at least one rare-earth material selected from the group consisting of Y, Nd, Gd, Eu, Sm, Er, Yb, Tb, Dy, Ho and Tm.

5. The method according to claim 1, wherein the holes formed in the splicing portion comprise holes penetrating the substrate so as not to reach the superconducting layer, or from the substrate to the stabilizing layer, the respective holes having a diameter of 10~100 μm and being arranged at a pitch of 1~1000 μm for oxygen in-diffusion paths.

6. The method according to claim 1, wherein the (c) etching each of the 2G ReBCO HTS CCs is carried out by wet etching or plasma dry etching.

7. The method according to claim 1, wherein in the (e) loading the 2G ReBCO HTS CCs and then evacuating the splicing furnace, the furnace has a pressure of $PO_2 \leq 10^{-5}$ mTorr, and splicing is performed at a temperature of 1100° C. or less, while a force of 0.1~30 MPa is applied to the splicing portion of the 2G ReBCO HTS CCs.

8. The method according to claim 1, wherein in the (f) increasing an inner temperature of the splicing furnace or in the (g) annealing a spliced zone, the spliced zone of the 2G ReBCO HTS CCs is compressed by an external load while being heated.

9. The method according to claim 1, wherein the (g) annealing a spliced zone comprises supplying an oxygen gas to the annealing furnace under a pressurized oxygen atmosphere at a temperature of 200~700° C. until the ReBCO has 6.4 to 7 moles of oxygen with respect to 1 mole of Re (rare-earth element) in ReBCO.

10. The method according to claim 1, wherein the (h) coating the spliced zone comprises coating silver (Ag) to a thickness of 2~40 μm on the spliced zone to improve overcurrent bypass efficiency.

* * * * *